(12) United States Patent
Chen et al.

(10) Patent No.: US 7,833,830 B2
(45) Date of Patent: Nov. 16, 2010

(54) 3D INTERCONNECT WITH PROTRUDING CONTACTS

(75) Inventors: Chien-Hua Chen, Corvallis, OR (US);
Zhizhang Chen, Corvallis, OR (US);
Neal W. Meyer, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 507 days.

(21) Appl. No.: 11/778,196

(22) Filed: Jul. 16, 2007

(65) Prior Publication Data

US 2007/0254405 A1 Nov. 1, 2007

Related U.S. Application Data

(62) Division of application No. 10/960,827, filed on Oct. 7, 2004, now Pat. No. 7,262,495.

(51) Int. Cl.
*H01L 21/00* (2006.01)
*H01L 23/48* (2006.01)

(52) U.S. Cl. .................. 438/108; 257/178; 257/276; 257/778

(58) Field of Classification Search ............ 438/108; 257/178, 276, 778
See application file for complete search history.

(56) References Cited

U.S. PATENT DOCUMENTS

| | | | |
|---|---|---|---|
| 5,055,426 A | 10/1991 | Manning | |
| 5,117,276 A | 5/1992 | Thomas et al. | |
| 5,229,647 A * | 7/1993 | Gnadinger | 257/785 |
| 5,275,330 A | 1/1994 | Isaacs et al. | |
| 5,424,245 A | 6/1995 | Gurther et al. | |
| 5,627,106 A | 5/1997 | Hsu et al. | |
| 5,870,289 A | 2/1999 | Tokuda et al. | |
| 5,943,574 A | 8/1999 | Tehrani et al. | |
| 5,998,292 A | 12/1999 | Black et al. | |
| 6,025,730 A | 2/2000 | Akram et al. | |
| 6,239,025 B1 | 5/2001 | Bease et al. | |
| 6,291,331 B1 | 9/2001 | Wang et al. | |
| 6,479,376 B1 | 11/2002 | Huang et al. | |
| 6,534,374 B2 | 3/2003 | Johnson et al. | |
| 6,593,224 B1 | 7/2003 | Lin | |
| 6,649,441 B2 * | 11/2003 | Ruf | 438/50 |
| 6,703,286 B1 | 3/2004 | Yu et al. | |
| 6,710,446 B2 * | 3/2004 | Nagai et al. | 257/737 |
| 6,809,021 B2 * | 10/2004 | Ohtani et al. | 438/622 |
| 6,809,421 B1 * | 10/2004 | Hayasaka et al. | 257/777 |
| 6,903,443 B2 * | 6/2005 | Farnworth et al. | 257/621 |

(Continued)

FOREIGN PATENT DOCUMENTS

EP 0651449 5/1995

(Continued)

OTHER PUBLICATIONS

G.L.Sun, "Cool Plasma Activated Surface i Wafer Direct Bonding Technology", Journal de Physique.*

*Primary Examiner*—Matthew C Landau
*Assistant Examiner*—James M Mitchell

(57) ABSTRACT

This invention relates to a semiconductor having protruding contacts comprising, a first semiconductor substrate having at least one interconnect located substantially within the first substrate, and a second semiconductor substrate having at least one protruding contact point that substantially contacts at least one interconnect.

16 Claims, 8 Drawing Sheets

U.S. PATENT DOCUMENTS

| | | | |
|---|---|---|---|
| 6,962,835 B2 * | 11/2005 | Tong et al. | 438/108 |
| 7,086,147 B2 * | 8/2006 | Caletka et al. | 29/840 |
| 7,157,787 B2 * | 1/2007 | Kim et al. | 257/621 |
| 7,294,568 B2 * | 11/2007 | Goodner et al. | 438/619 |
| 7,312,487 B2 * | 12/2007 | Alam et al. | 257/278 |
| 7,358,602 B2 * | 4/2008 | Hara | 257/689 |
| 7,557,452 B1 * | 7/2009 | Williams et al. | 257/778 |
| 2001/0008777 A1 | 7/2001 | Seyyedy | |
| 2002/0022335 A1 | 2/2002 | Chen | |
| 2002/0074637 A1 | 6/2002 | McFarland | |
| 2002/0197844 A1 | 12/2002 | Johnson et al. | |
| 2003/0019836 A1 | 1/2003 | Bradley et al. | |
| 2003/0071330 A1 * | 4/2003 | Romano et al. | 257/669 |
| 2006/0043535 A1 * | 3/2006 | Hiatt | 257/621 |

FOREIGN PATENT DOCUMENTS

| | | |
|---|---|---|
| EP | 1329489 | 7/2003 |
| WO | WO 0161743 | 8/2001 |

* cited by examiner

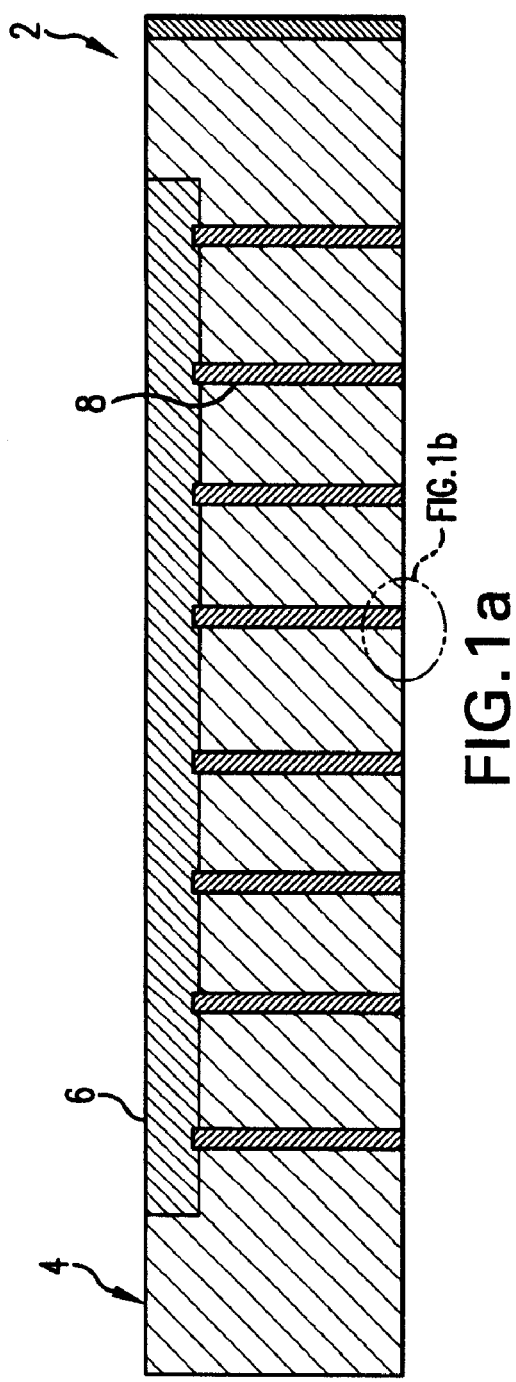
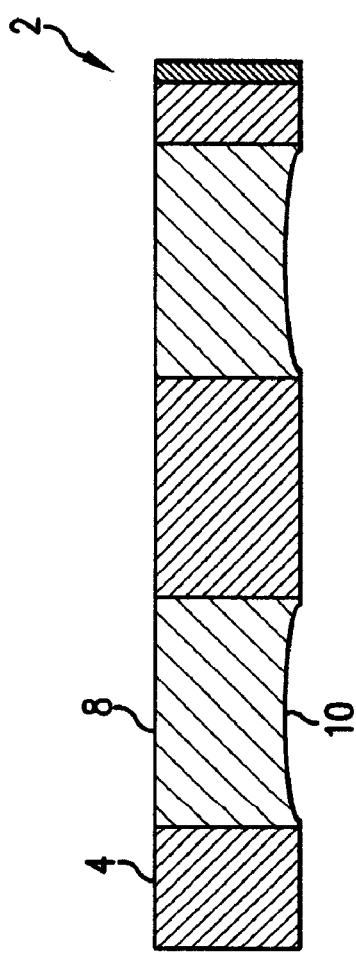

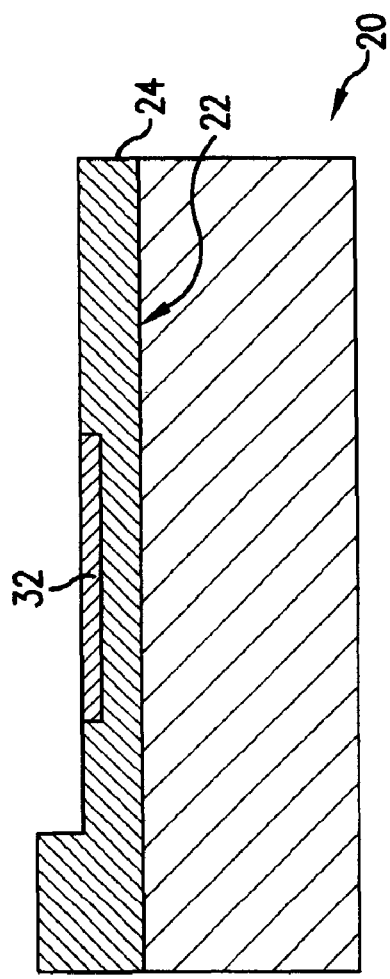
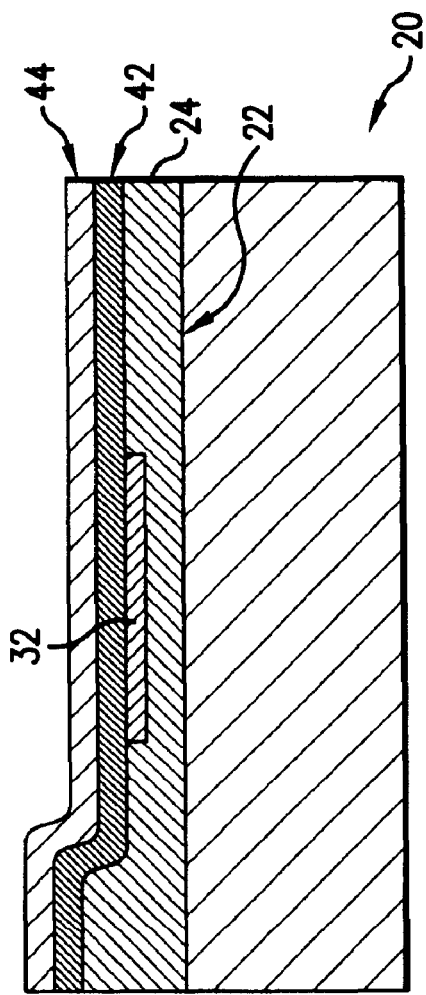

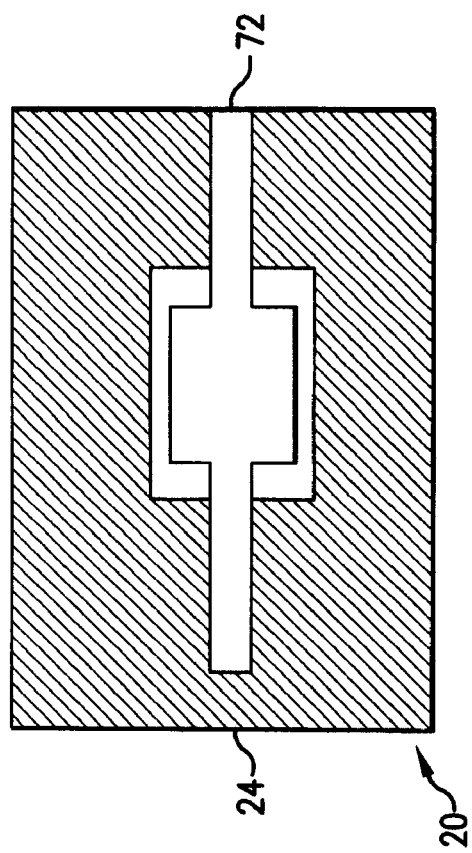
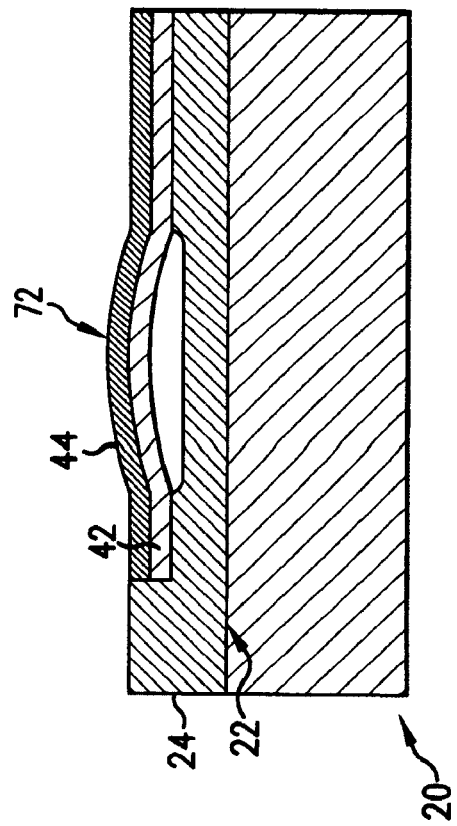
FIG. 7b
FIG. 7a

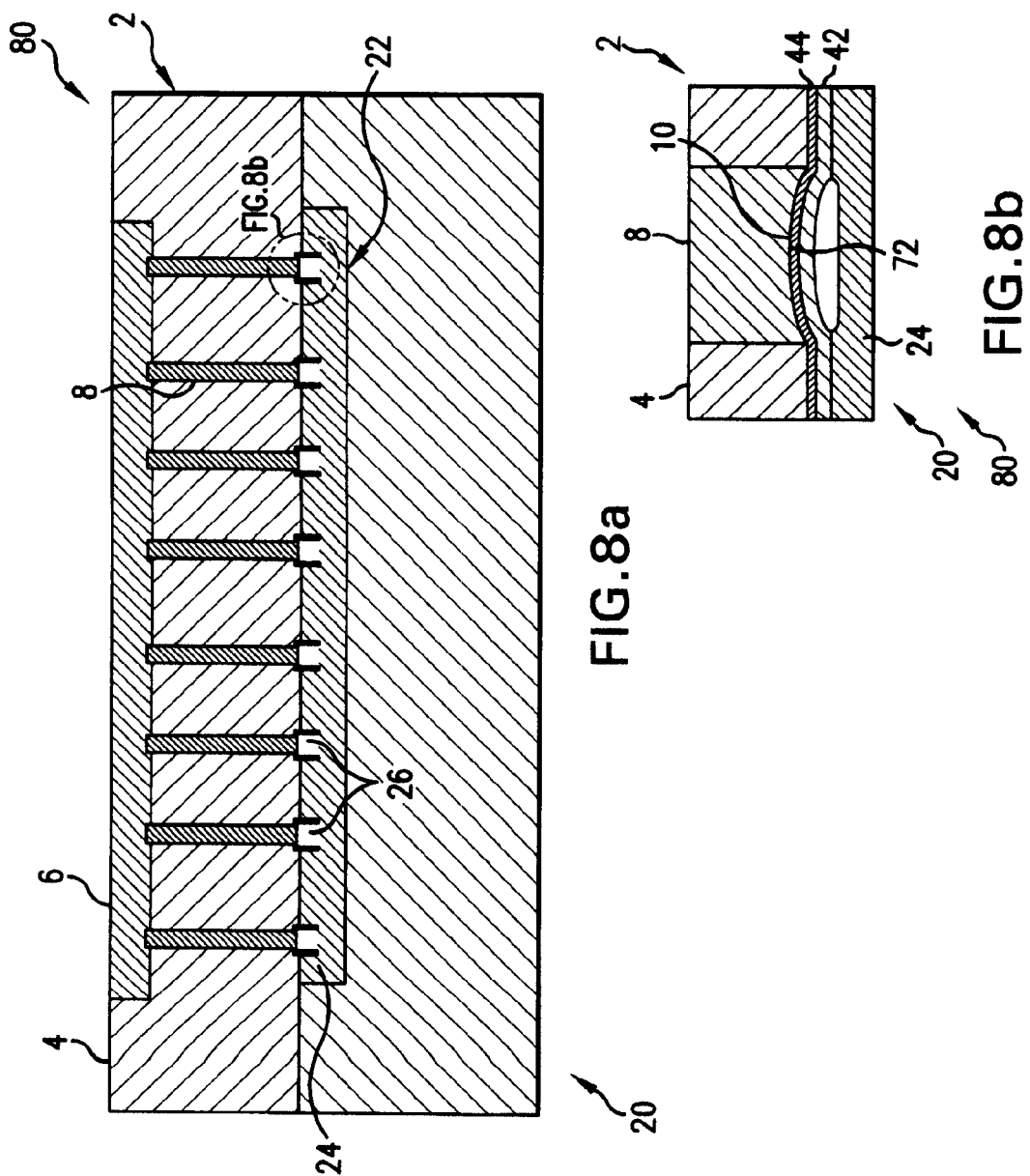

3D INTERCONNECT WITH PROTRUDING CONTACTS

This application is a divisional of 10/960,827 filed Oct. 7, 2004 now U.S. Pat. No. 7,262,495, which is hereby incorporated by reference.

BACKGROUND OF THE INVENTION

1. Field of the Invention

This invention relates to a semiconductor having protruding contacts comprising, a first semiconductor substrate having at least one interconnect located substantially within the first substrate, and a second semiconductor substrate having at least one protruding contact point that substantially contacts at least one interconnect.

2. Description of the Related Art

Prior to the present invention, as set forth in general terms above and more specifically below, it is known in the semiconductor art, that two semiconductor substrates can be joined together at low temperatures by using well-known plasma-enhanced bonding processes. These low-temperature substrate joining techniques can be used to package MEMS (microelectromechanical systems) or NEMS (nanoelectromachanical systems) devices hermetically as well as 3-D wafer stacking. With respect to these low-temperature substrate joining techniques, the surface of the substrates to be joined need to be flat and very smooth (<20 A rms surface roughness over 2 μm×2 μm). Consequently, the surfaces are usually planarized with chemical mechanical polishing (CMP).

It is well known that the CMP planarization process creates some unique challenges for wafer-to-wafer interconnect applications since it is difficult to planarize the interconnect plug (or contact points) and the surrounding area evenly. The interconnect between two substrates may fail if dishing on the plugs occurs during the CMP process. Also, plasma-enhanced bonding may fail if the plugs surfaces are higher than the surrounding area, which prevents the two substrates from contacting at the atomic level.

It is also known, in the semiconductor art, that compliant intermediate layers (such as BCB (benzocyclobutene)) are often used to adhere two substrates together as well as to form an interconnect at the same time. This approach works fine for many 3-D interconnect applications, but does not work when both 3-D interconnect and hermetic packaging are required since BCB is not hermetic.

It is further known, in the semiconductor art, that Au bump or solder ball techniques can be used to flip-chip bond one substrate to another. However, none of these techniques provide both a good electrical interconnect between the substrates and hermetic packaging at the wafer level as the bumps or balls tend to cause a standoff between the circuits or substrates. The interconnect density is also limited with this approach.

Finally, it is known, in the interconnect art, to bond the interconnect to the pad of the circuit device. Typical techniques involve heat, eutectic bonding, electrical bonding, and/or mechanical bonding. However, many of these techniques do not provide an adequate bond for a variety of reasons.

It is apparent from the above that there exists a need in the semiconductor art for a semiconductor construction technique that works with both 3-D interconnect and hermetic packaging, but which at the same time allows the two substrates to be efficiently bonded so that they contact each other at the atomic level. It is a purpose of this invention to fulfill this and other needs in the art in a manner more apparent to the skilled artisan once given the following disclosure.

SUMMARY OF THE INVENTION

Generally speaking, an embodiment of this invention fulfills these needs by providing a semiconductor having protruding contacts comprising, a first semiconductor substrate having at least one interconnect located substantially within the first substrate, and a second semiconductor substrate having at least one protruding contact point that substantially contacts at least one interconnect.

In certain preferred embodiments, the first semiconductor substrate includes a CMOS (complementary metal oxide semiconductor) circuit on a top surface and through-silicon interconnect plugs. Also, the first semiconductor substrate may include an optical MEMS or NEMS device. Also, the surface of the interconnect that contacts the protruding contact point of the second substrate may be thinned and chemically mechanically polished.

In another further preferred embodiment, the second semiconductor substrate may include CMOS or other high density (nanotechnology devices) circuitry and at least one protruding contact point. Also, the contact point is formed by layering various metal and dielectric films, including a compressive dielectric film, wherein etching is employed to cause the compressive dielectric film to bow up slightly and create a protruding contact point.

The preferred semiconductor, according to various embodiments of the present invention, offers the following advantages: ease of assembly; excellent electrical contact characteristics; and good durability. In fact, in many of the preferred embodiments, these factors of ease of assembly and excellent electrical contact characteristics are optimized to an extent that is considerably higher than heretofore achieved in prior, known semiconductor devices.

The above and other features of the present invention, which will become more apparent as the description proceeds, are best understood by considering the following detailed description in conjunction with the accompanying drawings, wherein like characters represent like parts throughout the several views and in which:

BRIEF DESCRIPTION OF THE DRAWINGS

FIGS. 1a and 1b are a schematic illustrations of a semiconductor substrate having a through-silicon interconnect with FIG. 1b illustrating a detailed view of the end of the through-silicon interconnect, according to one embodiment of the present invention;

FIG. 3 is a schematic illustration of a patterned sacrificial film prior to forming a contact pad, according to the ongoing embodiment of the present invention;

FIG. 4 is a schematic illustration of a deposited compressive film that will form a contact pad, according to the ongoing embodiment of the present invention;

FIGS. 5a and 5b are schematic illustrations of a planarized contact pad prior to release, wherein FIG. 5a is the cross sectional view and FIG. 5b is the top-down view, according to the ongoing embodiment of the present invention;

FIGS. 6a and 6b are schematic illustrations of a patterned photoresist that will define the contact pads during a subsequent etching process, wherein FIG. 6a is the cross sectional view and FIG. 6b is the top-down view, according to the ongoing embodiment of the present invention;

FIGS. 7a and 7b are schematic illustrations of a released contact pad after removal of the sacrificial layer wherein FIG. 7a is the cross sectional view and FIG. 7b is the top-down view, according to the ongoing embodiment of the present invention;

FIGS. 8a and 8b are schematic illustrations of the final interconnect assembly formed by plasma bonding substrates one and two together, wherein FIG. 8b illustrates a detailed view of a contact point between substrates one and two, according to the ongoing embodiment of the present invention;

DETAILED DESCRIPTION OF THE INVENTION

Figure 2:
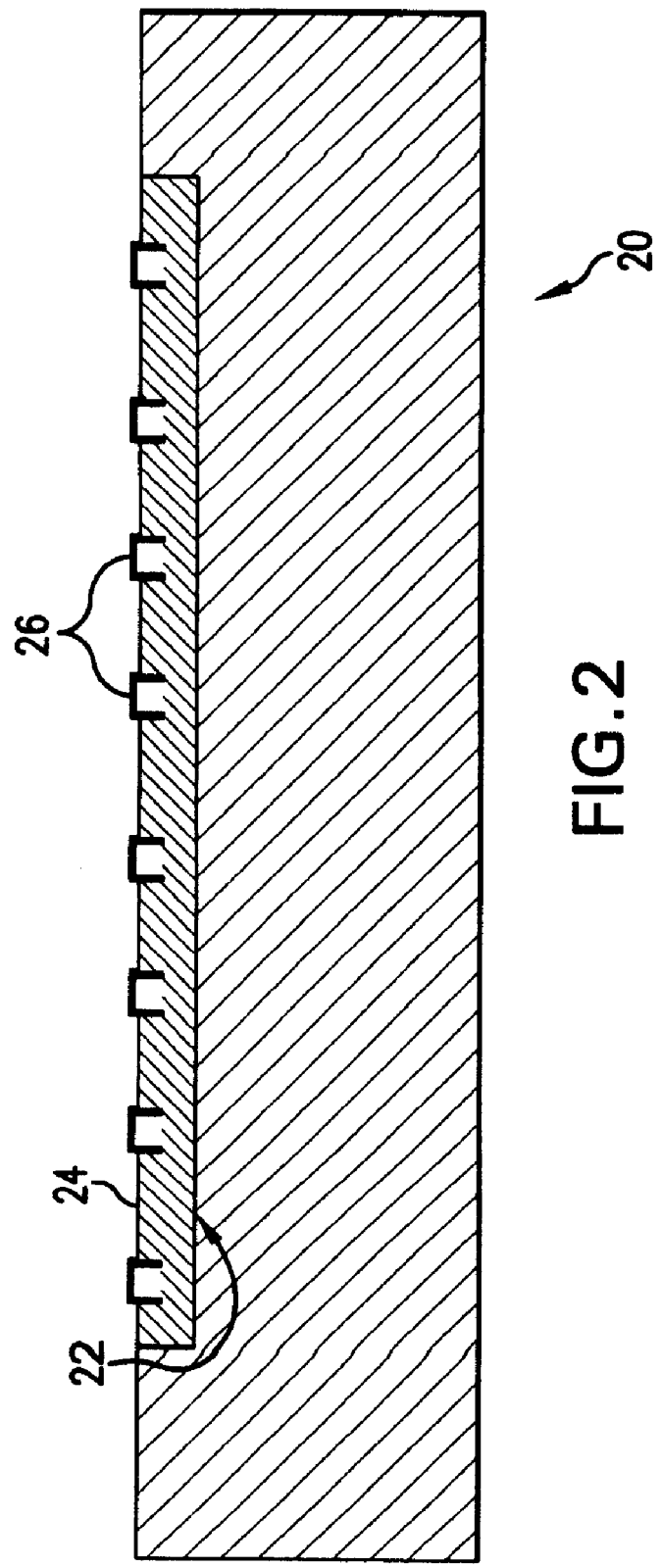
FIG. 2 is a schematic illustration of a second semiconductor substrate with CMOS circuitry and contact points, to be bonded to the first substrate, according to the ongoing embodiment of the present invention.

With reference first to FIG. 1, there is illustrated one preferred embodiment for use of the concepts of this invention. FIG. 1 illustrates a first semiconductor substrate 2. Substrate 2 includes, in part, complementary metal oxide semiconductor (CMOS) 6, and through silicon interconnect plugs 8. Preferably, substrate 2 may be conventionally thinned and chemically mechanically polished (CMP) on the backside to prepare the plugs 8 for bonding. Also, through silicon interconnect plugs can be constructed of any suitable material such as tungsten, copper, gold or the like. Finally, each substrate 2 and 20 (FIG. 2) may not contain through silicon interconnect plugs 8 and the two substrates can be bonded together face-to-face.

With respect to FIG. 1b, a detailed view of the dished surface 10 of the through silicon interconnect plug 8 is illustrated. The dished surface 10 typically results from the CMP process. It is to understood that the dished surface 10 that opposes the protruding contact point 26 (FIG. 2) does not have to be recessed, it can be recessed, flat or a released compressively stressed protruding contact, as well.

With respect to FIG. 2, a second semiconductor substrate 20 is illustrated. Substrate 20 includes, in part, substrate backside 22, CMOS 24, and contact points 26. The details of how contact points 26 are fabricated will be discussed in relation to FIGS. 3-8.

With respect to FIG. 3, patterned semiconductor substrate 20 is illustrated. Substrate 20 includes, in part, CMOS 24, and sacrificial, film 32. As shown in FIG. 3, CMOS 24 and sacrificial film 32 are conventionally patterned to form a contact pad. Also, sacrificial film 32, preferably, is a silicon film. It is to be understood that the sacrificial layer can be any material that can be selectively etched and removed relative to other layers or materials in the device.

With respect to FIG. 4, semiconductor wafer 20 is illustrated with compressive and contact films deposited. Wafer 20 includes, in part, CMOS 24, sacrificial film 32, compressive dielectric film 42, and metallic contact film 44. As shown in FIG. 4, compressive dielectric film 42 and metallic contact film 44 are conventionally deposited on top of sacrificial layer 32 and CMOS 24. Also, compressive dielectric film 42, preferably, is constructed of $Si_3N_4$. It is to be understood that the compressive film 42 can also be other materials as long as it is compressively stressed in the final device. Finally, metallic contact film 44, preferably, is constructed of any suitable metallic material such as a noble metal (for example, gold) various solder materials, or typical multi-metal layer contact structures such as Cu/Au and Cu/Ni/Au. Finally, it is to be understood that the metal layer 44 could, with the proper materials set, theoretically be the compressive layer, as well.

Figure 5B:
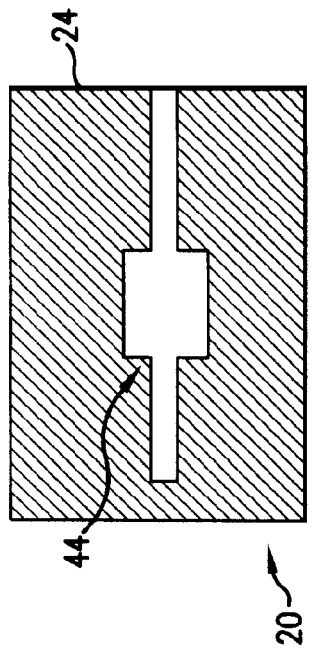
Figure 5A:
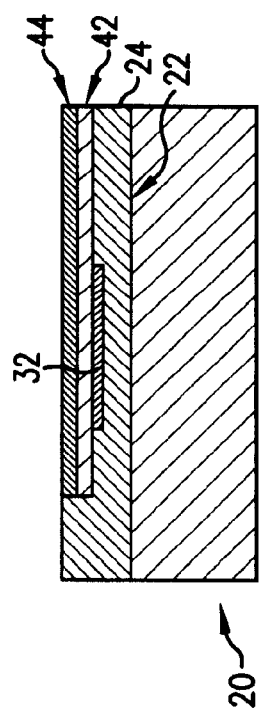

With respect to FIGS. 5a and 5b, semiconductor wafer 20 is illustrated. After contact layers have been deposited on semiconductor wafer 20 (FIG. 4), it is planarized according to a conventional CMP process, such as the Damascene process. As can be seen in FIG. 5a, at this point wafer 20 includes, in part, CMOS 24, sacrificial film 32, compressive dielectric film 42, and metallic contact film 44. As can be seen in FIG. 5b, only CMOS 24 and metallic film 44 are exposed after the planarization process.

Figure 6B:
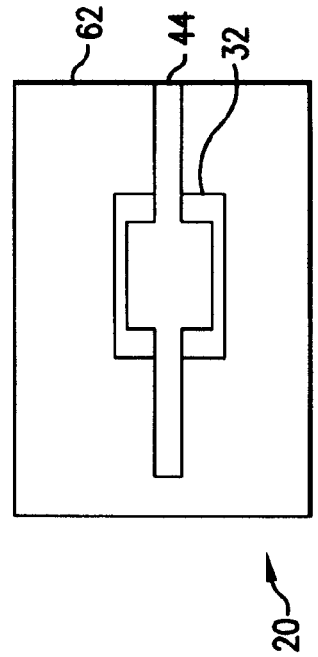
Figure 6A:
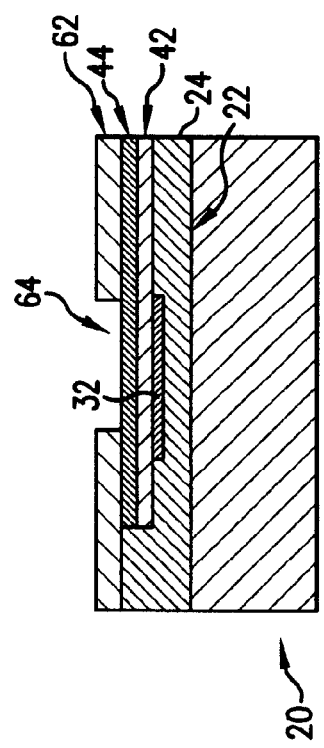

With respect to FIGS. 6a and 6b, semiconductor wafer 20 is illustrated with patterned photoresist prior to etching to define the contacts. After semiconductor wafer 20 (FIG. 5) has been planarized, it is patterned and etched, according to conventional techniques. Semiconductor wafer 20 at this point includes, in part, CMOS 24, sacrificial film 32, compressive dielectric film 42, metallic contact film 44, patterning film 62, and contact point 64. Preferably, patterning film 62 is constructed of any suitable material such as any suitable polymeric material for patterning via photo-imaging, embossing, imprinting or other common techniques. As can be seen in FIG. 6a, patterning film 62 is conventionally deposited on metallic film 44. Compressive dielectric film 42 and metallic film 44 are then conventionally patterned and etched to form contact point 64. During this patterning and etching process, sacrificial film 32 is also exposed, as shown in FIG. 6b. It is to be understood that the contact points can be patterned in other shapes, in addition to rectangular.

With respect to FIGS. 7a and 7b, semiconductor wafer 20 is illustrated after removal of sacrificial layer 32. After semiconductor wafer 20 (FIG. 6) has been patterned and etched (FIG. 6), it is again etched, according to conventional techniques, such as $XeF_2$ or $SF_6$ plasma etching. Semiconductor wafer 20 at this point includes, in part, substrate CMOS 24, compressive dielectric film 42, metallic contact film 44, and released contact pad 72. As can be seen in FIG. 7a, released contact pad 72 is formed after sacrificial film 32 is etched away underneath compressive dielectric film 42 and metallic contact film 44. Once the contact points are released, compressive dielectric film 42 causes released contact pad 72 to bow up slightly and protrude from the planarized surface. The patterning film 62 (FIG. 6) is then conventionally stripped. FIG. 7b shows a top-down view of semiconductor wafer 20 with CMOS 24 and released contact pad 72 exposed.

With respect to FIGS. 8a and 8b, completed semiconductor interconnect assembly 80 is illustrated. After semiconductor wafer 20 (FIG. 7) has been completed, it is then contacted with semiconductor substrate 2 (FIG. 2) in order to form semiconductor interconnect assembly 80. Semiconductor interconnect assembly 80 includes, in part, CMOS 6, through silicon interconnect plugs 8, CMOS 24, and contact points 26. As can be seen in FIG. 8a, semiconductor substrate 2 and semiconductor wafer 20 are conventionally plasma treated (such as in $N_2$, $O_2$ or Ar plasma) and bonded together. It is to be understood that interconnect assembly 80 maybe located on the top side, the back side or multiple sides of each substrate 2 (FIG. 1) and 20 (FIG. 2).

With respect to FIG. 8b, contact pad 72 of semiconductor wafer 20 protrudes upwards towards dished surface 10 of plug 8 on semiconductor substrate 2. In this manner, an excellent interconnect is insured even when the surfaces of the through silicon interconnect plugs 8 are slightly dished.

Figure 9:
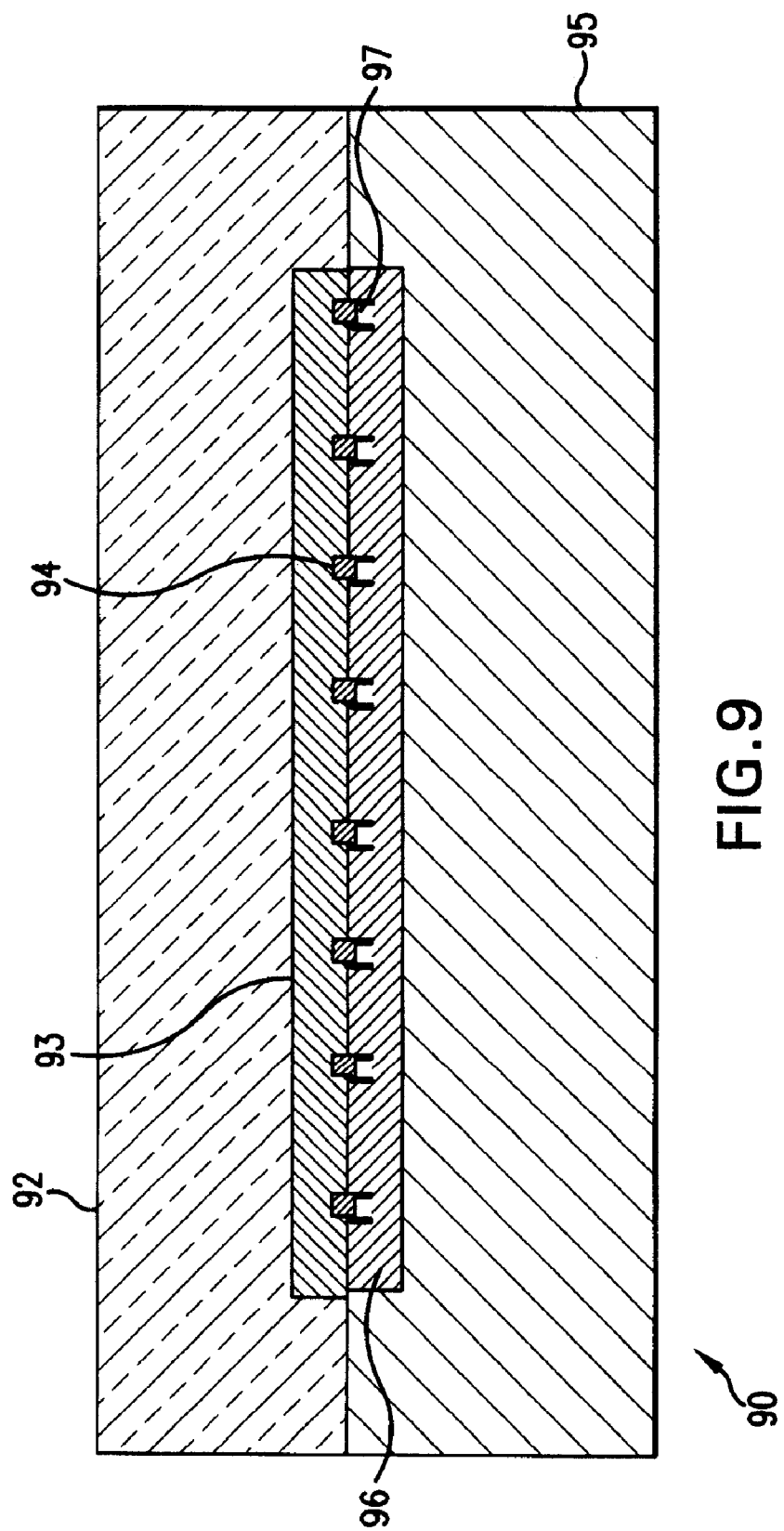
FIG. 9 is a schematic illustration of face-to-face bonding with an optical MEMS device, according to another embodiment of the present invention.

With respect to FIG. 9, semiconductor 90 is illustrated. Semiconductor 90 includes, in part, glass substrate 92, CMOS 93, interconnects 94, an optical MEMS or NEMS devices 95, CMOS 96 and released contact pads 97. As illustrated in FIG. 9, a face-to-face bonding of the glass substrate and the MEMS device is achieved through a conventional plasma enhanced bonding process. In this manner, released contact pads 97 protrude upward towards interconnect 94 in order to form an excellent interconnect between the two devices in a similar manner as discussed above with respect to FIGS. 1-8.

Figure 10:
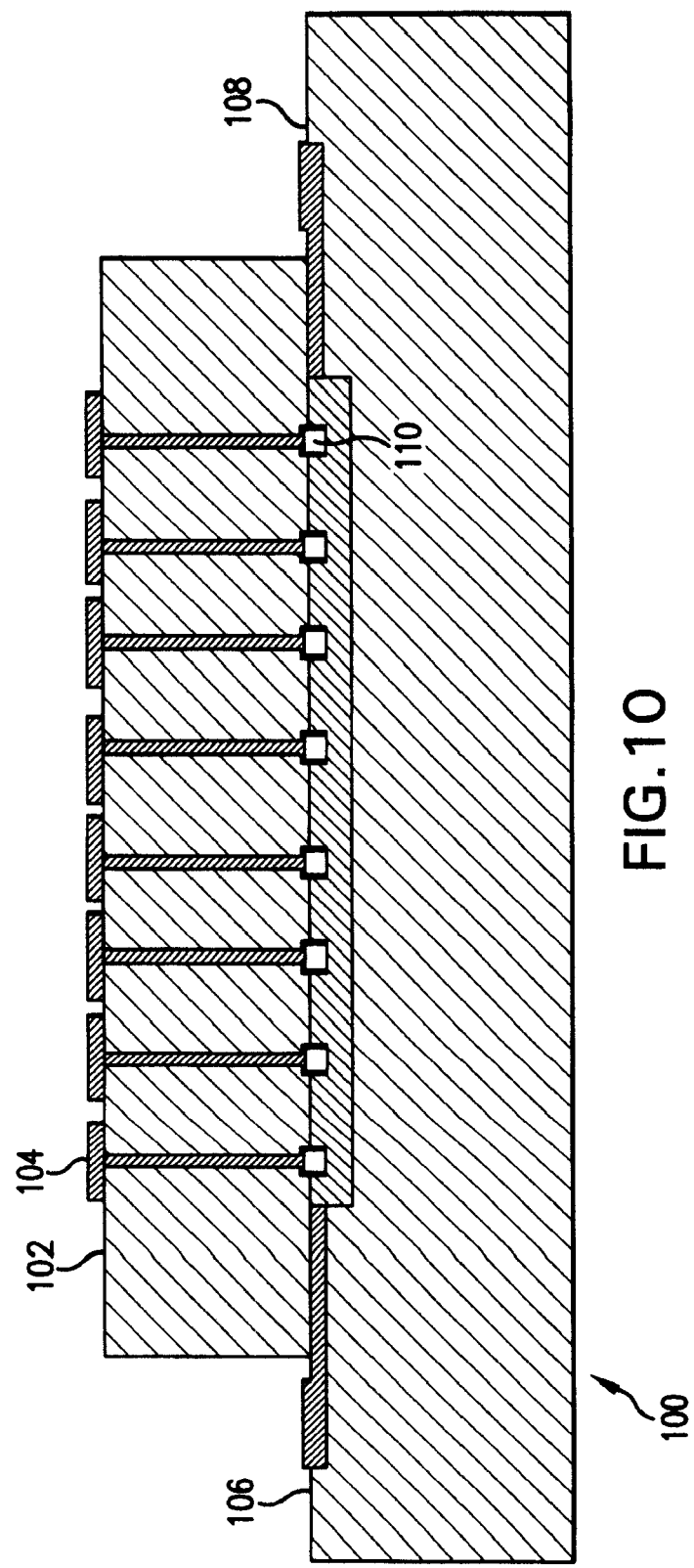
FIG. 10 is a schematic illustration of face-to-back wafer bonding with high density circuitry, according to still another embodiment of the present invention.

Finally, with respect to FIG. 10, semiconductor 100 is illustrated. Semiconductor 100 includes, in part, substrate backside or lid 102, through silicon interconnect plugs 104, substrate backside 106, high density circuitry devices 108, and released contact pads 110. High density circuitry devices 108 can be, preferably, nanotechnology devices. As illustrated in FIG. 10, lid 102 will not only provide a cap over substrate 106 and high density circuitry devices 108, but also increase the number of input-output counts.

While the present invention has been illustrated with respect to particular semiconductor devices, it is to be understood that the present invention can also be utilized in other devices such as, but not limited to, non-CMOS devices (Jet-MOS, sensors, etc), NEMS devices, photonics devices, various medical devices, FLEX circuits, PCBs (Printed Circuit Boards), any type of protruding contacts to flat contacts, any type of protruding contacts to protruding contacts, and various multi-layer (2 or more) substrate stacks without deviating from the scope of the present invention.

Also, the present invention can be embodied in any computer-readable medium for use by or in connection with an instruction-execution system, apparatus or device such as a computer/processor based system, processor-containing system or other system that can fetch the instructions from the instruction-execution system, apparatus or device, and execute the instructions contained therein. In the context of this disclosure, a "computer-readable medium" can be any means that can store, communicate, propagate or transport a program for use by or in connection with the instruction-execution system, apparatus or device. The computer-readable medium can comprise any one of many physical media such as, for example, electronic, magnetic, optical, electromagnetic, infrared, or semiconductor media. More specific examples of a suitable computer-readable medium would include, but are not limited to, a portable magnetic computer diskette such as floppy diskettes or hard drives, a random access memory (RAM), a read-only memory (ROM), an erasable programmable read-only memory, or a portable compact disc. It is to be understood that the computer-readable medium could even be paper or another suitable medium upon which the program is printed, as the program can be electronically captured, via, for instance, optical scanning of the paper or other medium, then compiled, interpreted or otherwise processed in a single manner, if necessary, and then stored in a computer memory.

Those skilled in the art will understand that various embodiment of the present invention can be implemented in hardware, software, firmware or combinations thereof. Separate embodiments of the present invention can be implemented using a combination of hardware and software or firmware that is stored in memory and executed by a suitable instruction-execution system. If implemented solely in hardware, as in an alternative embodiment, the present invention can be separately implemented with any or a combination of technologies which are well known in the art (for example, discrete-logic circuits, application-specific integrated circuits (ASICs), programmable-gate arrays (PGAs), field-programmable gate arrays (FPGAs), and/or other later developed technologies. In preferred embodiments, the present invention can be implemented in a combination of software and data executed and stored under the control of a computing device.

It will be well understood by one having ordinary skill in the art, after having become familiar with the teachings of the present invention, that software applications may be written in a number of programming languages now known or later developed.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. A method for constructing a semiconductor, comprising the steps of:
   constructing a first semiconductor substrate having at least one interconnect located substantially within the first substrate; and
   constructing a second semiconductor substrate having at least one protruding contact point that substantially contacts the at least one interconnect, wherein constructing the second semiconductor substrate comprises:
   forming an electrically conductive film providing the at least one protruding contact point; and
   coupling a compressively stressed film to the electrically conductive film so as to deform the electrically conductive film into the at least one protruding contact point.

2. The method, as in claim 1, wherein the step of constructing the first semiconductor substrate is further comprised of the step of:
   installing a first complementary metal oxide semiconductor (CMOS) substantially within a first substrate such that the CMOS interacts with the at least one interconnect.

3. The method, as in claim 2, wherein the step of installing the CMOS is further comprised of the step of:
   thinning and polishing a portion of the first substrate.

4. The method, as in claim 3, wherein the polishing step is further comprised of the step of:
   chemically mechanically polishing the first substrate.

5. The method, as in claim 1, wherein the step of constructing the second semiconductor substrate is further comprised of the step of:
   installing a second CMOS substantially within a second substrate such that the CMOS interacts with the at least one protruding contact point.

6. The method, as in claim 5, wherein the method is further comprised of the steps of:
   patterning the second CMOS; and
   patterning a sacrificial film substantially over the second CMOS in order to form a contact pad.

7. The method, as in claim 6, wherein the method is further comprised of the steps of:
   depositing a compressive dielectric film substantially over the second CMOS and the sacrificial film; and
   depositing a metallic contact film substantially over the compressive dielectric film.

8. The method, as in claim 7, wherein the method is further comprised of the step of:
   planarizing the metallic film.

9. The method, as in claim 8, wherein the planarizing step is further comprised of the step of:
   chemically mechanically polishing the metallic film.

10. The method, as in claim 8, wherein the method is further comprised of the step of:

patterning a film substantially over the metallic contact film.

11. The method, as in claim 10, wherein the method is further comprised of the step of:

patterning and etching the metallic contact film and the compressive dielectric film in order to form a contact point.

12. The method, as in claim 11, wherein the method is further comprised of the step of:

exposing the sacrificial film.

13. The method, as in claim 12, wherein the method is further comprised of the step of:

etching the sacrificial film such that the contact point is released which causes the contact pad to bow up slightly and protrude from the planarized surface.

14. The method, as in claim 13, wherein the method is further comprised of the step of:

stripping the patterning film from the metallic contact film.

15. The method, as in claim 1, further comprising releasing the compressively stressed film such that the compressively stressed film deforms the electrically conductive film into the at least one protruding contact point.

16. The method, as in claim 1, wherein the at least one interconnect is dished.

* * * * *